United States Patent [19]

Baker et al.

[11] Patent Number: 4,620,572
[45] Date of Patent: Nov. 4, 1986

[54] RADIAL REFORM HEAD

[75] Inventors: David E. Baker, Manassas; Howard L. Kelly, Warrenton; Keith W. Meranda, Manassas, all of Va.

[73] Assignee: International Business Machines Corporation, Armonk, N.Y.

[21] Appl. No.: 745,452

[22] Filed: Jun. 14, 1985

[51] Int. Cl.⁴ ............................................. B21F 45/00
[52] U.S. Cl. ...................................................... 140/105
[58] Field of Search .................. 140/105; 72/355, 383, 72/393, 399

[56] References Cited

U.S. PATENT DOCUMENTS

| | | | |
|---|---|---|---|
| 2,196,619 | 4/1940 | Andresen | 72/399 |
| 3,331,912 | 7/1967 | Stricker et al. | 174/50 |
| 3,427,849 | 2/1969 | Ainsworth | 72/296 |
| 3,515,175 | 6/1970 | Hudson | 140/1 |
| 3,728,769 | 4/1973 | Judge et al. | 29/203 |
| 4,293,998 | 10/1981 | Kawa et al. | 29/564.1 |
| 4,411,149 | 10/1983 | Delorme | 72/385 |
| 4,470,289 | 9/1984 | Sinclair et al. | 72/401 |

FOREIGN PATENT DOCUMENTS 977959 4/1951 France ................. 72/393

OTHER PUBLICATIONS

J. Funari, Module Pin Reformer, Oct. 1971, pp. 1 & 2.

*Primary Examiner*—Lowell A. Larson
*Attorney, Agent, or Firm*—S. Meyers; J. Abzug; M. H. Klitzman

[57] ABSTRACT

A radial reform head for reforming the shape of the perimeter pins of a semiconductor module is provided. The radial reform head has a plate having edges defining an aperture, wherein the dimensions of the edges are such that the desired length of a row of reformed pins is equal to the length of the edges. A module handler for inserting the pins of a module into a stationary insert in the aperture is also provided.

Side reform jaws, preferably four, for reforming the perimeter rows of pins except for the corner pins, and corner reform jaws, preferably four, for reforming the corner pins are situated so that they can be moved radially to and from the pins by pneumatic cylinders. The reform jaws have extended portions which contact the pins when the cylinders are actuated by a signal from the module handler, and force the pins against the edges which define the aperture of the plate thus reforming the pins to a particular dimension. The cylinders and jaws have common center lines and all jaws and cylinders simultaneously move radially from the reform head center when the cylinders are actuated.

6 Claims, 8 Drawing Figures

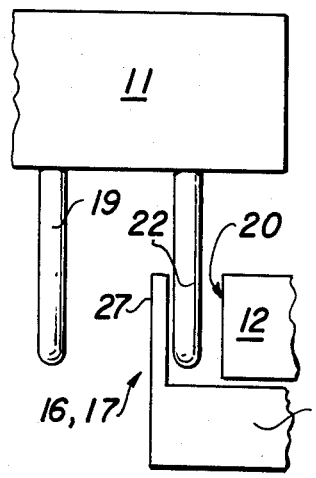
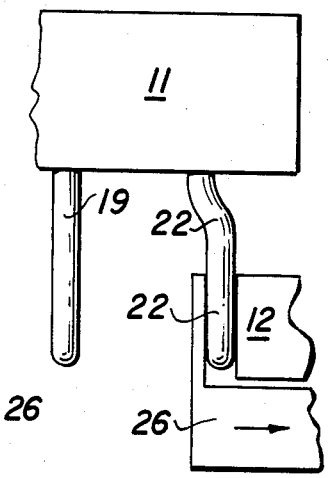
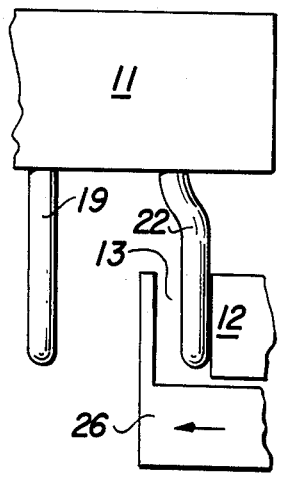
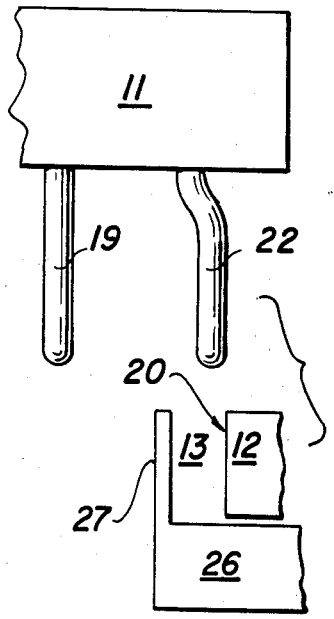
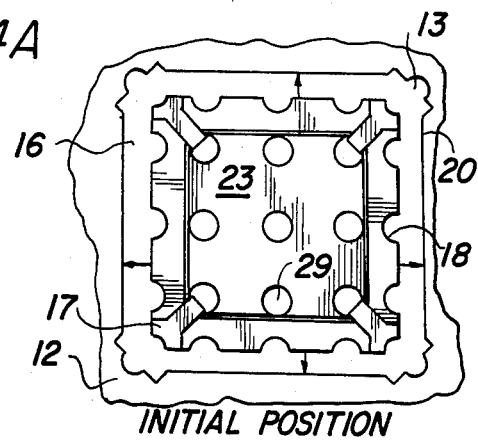
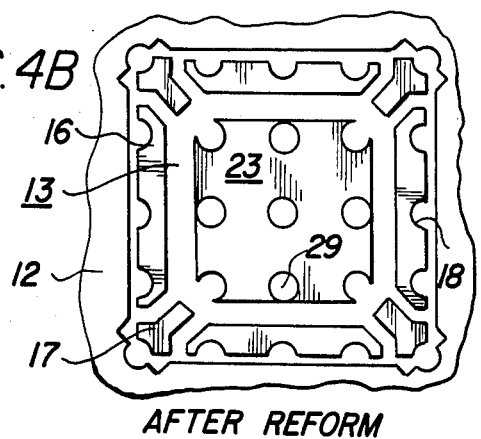

RADIAL REFORM HEAD

DESCRIPTION

1. Field of Invention

This invention relates to semiconductor modules. More particularly, it relates to an apparatus for reforming the pins of a semiconductor module.

2. Background of the Invention

In this invention a reform head is used to reform pins during the manufacture of semiconductor modules. Modern day semiconductor modules typically have semiconductor devices (i.e. chips) on their top surface and a plurality of rows of pins on their bottom surface. Semiconductor modules are plugged into circuit boards or cards. The user of semiconductor modules does not always use circuit boards or cards that have mating holes that are configured on the same centers as the pins on the semiconductor modules. When the pin configuration of a semiconductor module must be altered so that the pin configuration will match the mating hole configuration of a mother board or card, the module pins are typically altered by a reform head. For example, the perimeter pins of a module may be spaced 87 mils from the adjacent row of interior pins, while the corresponding holes on the board may be spaced 100 mils apart. In this situation the perimeter pins may be reformed by bending the perimeter pins so that the end of the pin that mates with the board or card is 100 mils from the end of the adjacent interior pins.

In addition to reforming pins, the pin reform head must accommodate large scale module production. Thus, methods of individually reforming the perimeter pins of a module are inadequate.

The performance of reform heads can be measured by product reform quality and reform head reliability. Product reform quality is a function of; the measurement of how parallel the bottom straight portion of the reformed pin, (i.e. the end of the pin that mates with the board or card), is in relation to the non-reformed pins; and the resultant pin to pin pitch after the reform process. If the bottom straight portion is not sufficiently parallel to the non-reformed pins, then the module will not easily plug into the board or card. This is a major problem when considered in view of the fact that robots or other automatic component insertion machines, which are essential to large scale production, cannot be used if the bottom straight portions are not parallel. If the resultant pin to pin pitch does not match the hole to hole pitch of the board or card, the mounting of the modules on the card or board will be unsuccessful.

In addition to insertion problems, there are card reliability problems associated with poor reform quality. Some reformed pins may be sufficiently parallel to the non-reformed pins to be inserted, but may not be sufficiently parallel so that they do not cause stresses to be transmitted to the solder joints which connect and hold the pins to the modules. These stresses are caused by misformed pins binding against the cards or boards after insertion. Such solder joint failures are a major source of reliability problems and result in expensive repairs and machine down time.

Reform head reliability is a function of how long the reform head will operate until there is mechanical failure.

A comparison of several types of reform heads, in terms of product reform quality and reform head reliability, follows.

The force die comprises a metal plate with a plurality of holes on the same pitch as the interior pins of a module. The perimeter holes are slotted holes. As module pins are forced into the die, the perimeter pins are reformed as they are forced through the slotted hole. The reform head reliability is excellent since there are no moving parts associated with the force die. However, product reform quality is poor. The bottom straight portions of the perimeter pins are not sufficiently parallel to each other or to the interior pins.

Systems using jaws to reform perimeter module pins have also been used. One such system is a two position jaw system which comprises a pair of jaws and a rotatable stage which a module is mounted on. The jaws each grasp a row of perimeter pins on opposite sides of the module, and spread those pins a desired distance. The module is then rotated 90 degrees, and a similar pair of jaws spreads the remaining perimeter pins. The major problem with this system is that the product reform quality of the corner pins is usually poor. The poor quality results primarily from the corner pins being adjusted twice. Neither adjustment is extremely accurate, and the second adjustment usually compounds any errors that occurred during the first adjustment.

Other systems use a plurality of jaws which move in and out from the center of the module pins. Two such systems utilize sets of cams and gears respectively to move the jaws toward the perimeter module pins, and grasp the pins. The jaws are then retracted a predetermined distance so the pins are reformed by the desired increment utilizing these systems. Product reform quality is acceptable, but reform head reliability presents a problem. These systems rely heavily on the need for multi-axis motion of the cams or gears that comprise the system. These systems frequently bind up during operation, resulting in an unacceptable amount of non-production time.

Thus, the need exists for a reform head system for reforming the perimeter pins of semiconductor modules, which exhibits excellent product reform quality and excellent reform head reliability. Such a system should be capable of handling large scale production volumes.

SUMMARY OF THE INVENTION

It is an object of the present invention to provide a reform head for reforming the perimeter pins of semiconductor modules in such a manner that reform quality is excellent, i.e., the reformed pins are substantially parallel to the non-reformed pins and do not bind when plugged into the holes of a board or card.

It is a further object of this invention to provide a reform head that is reliable, and can operate without multi-axis motion.

The radial reform head of the present invention accomplishes these objectives and overcomes the disadvantages of prior known constructions.

Briefly, the radial reform head comprises a plate having edges defining an aperture, wherein the dimensions of the edges are such that the desired length of a row of reformed pins is equal to the length of the edge. A module insertion means which inserts the pins of a semiconductor module into a stationary insert in the aperture, and a plurality of reform jaws are also provided. Preferably, eight reform jaws are provided, wherein four are side reform jaws which reform a row of perimeter pins, and four are corner reform jaws which each reform a corner pin. Pneumatic cylinders are provided to move the reform jaws radially to and from the perimeter pins.

During operation the module handler places the pins of a module vertically into the insert and then sends a signal to the cylinders so that they simultaneously move the jaws. At that time the reform jaws contact the perimeter module pins and pull the pins toward the plate edges until the pins contact the edge. When the pins contact the edges they are at the desired position, and are parallel to the non-reformed pins. The jaws are then radially moved back to their original position and the module handler removes the reformed module. All motion is in straight lines extending radially from the reform head center, thus there is no complex multi-axis motion to cause binding and manufacturing down time.

BRIEF DESCRIPTION OF THE DRAWINGS

FIGS. 3A, 3B, 3C, and 3D illustrate the steps that the radial reform head takes while reforming the pins of a module.

FIGS. 4A and 4B are plan views of the radial reform head which shows the reform jaws in their initial position prior to the pin reform operation, and in their final position after the pin reform operation, respectively.

DETAILED DESCRIPTION OF THE PREFERRED EMBODIMENTS

Figure 1:
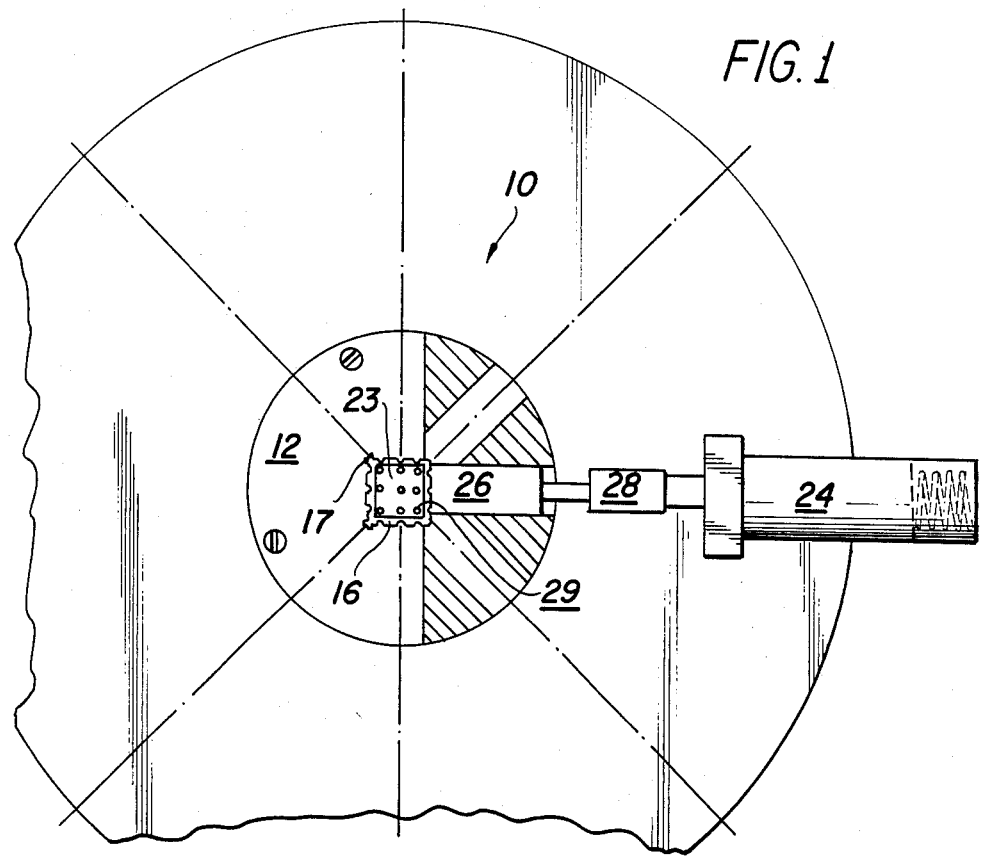
FIG. 1 is a plan view of an embodiment of the radial reform head.

The preferred embodiment of the present invention is illustrated by way of example in FIGS. 1–4. With specific reference to FIGS. 1 and 2, a radial reform head includes an annular top plate 12 having aperture 13 which is cut in the annular plate 12. Preferably the aperture 13 is substantially rectangular and, more particularly, the dimensions of the edges 20 of the top plate which define the aperture 13 are predetermined so that they are equal to the desired length of a row of reformed module connection pins 11. For example, if it is desired that the distance from the first pin 11 in a row to the last pin 11 be 12 mm after the perimeter pins are reformed, the dimension of each edge 20 will be 12 mm. The aperture 13 defined by edges 20 in plate 12 is clearly shown in FIGS. 4A and 4B. In each corner, where the edges 20 meet each other there is a notched area in the plate. The reason for the notched area in this embodiment is to allow clearance for the corner reform jaws 17. If different jaw configurations are used the notched area may not be required to practice this invention.

Figure 2:
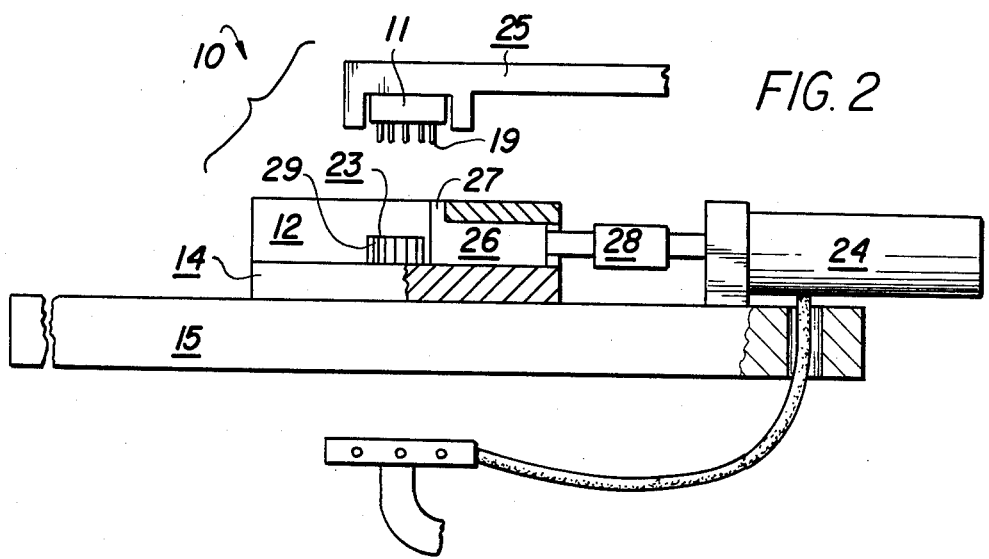
FIG. 2 is a side view in elevation of the same embodiment of the radial reform head as shown in FIG. 1.

Referring now to FIG. 2, the annular top plate 12 is suitably attached, i.e. by bolts, weld, epoxy, to a bottom plate 14 which is suitably attached to a base plate 15. A stationary insert 23 having an array of holes which are spaced to match the pitch of the interior module pins 19 is preferred, but is not absolutely necessary to practice the present invention. The stationary insert 23 is suitably attached to the bottom plate 14. FIGS. 4A and 4B show a plan view of insert 23. Note that there is a three by three array of holes 29 shown in insert 23. This is because this embodiment of the invention is demonstrated with a module having a five row by five row array of pins. If one wanted to practice this invention with a module having a nine row by nine row array of pins for instance, the insert 23 would have a seven row by seven row array of holes. The holes 29 are arranged so that they are aligned with interior module pins 19.

As is most clearly shown in FIGS. 4A and 4B, a plurality of reform jaws 16, 17 are oriented radially around the center of the aperture 13 of the annular top plate 12 lying between the insert 23 and edges 20. In preferred form there are eight reform jaws oriented around the center of aperture 13 as described above at 45 degree intervals. Four of these are side reform jaws 16 which each reform a particular row of perimeter pins except for the corner pins, and four of these are corner reform jaws 17 which will each reform one corner pin on the module. The four side jaws 16 are located 90 degrees from one another, and the four corner jaws 17 are located 90 degrees from one another. Each of the side reform jaws 16 contain a set of grooves 18 which are situated on the side of the jaws facing opposite from insert 23 and towards the edges to which define the aperture 13 in plate 12. Each of the grooves 18 are also colinear with the holes of insert 23. Each of the corner reform jaws 17 also contain a groove 18 which faces opposite from insert 23 toward the corners of opening edges 20, and which are colinear with the diagonal holes of insert 23.

Each reform jaw 16, 17, whether a side reform jaw 16, or a corner reform jaw 17, is comprised of a base portion 26, and an extended portion 27 (See FIGS. 2 and 3). The grooves 18 mentioned above are formed in the extended portion 27 of said jaws. The base portion 26 moves radially via sliding means commonly used in the art (not shown) below the top plate 12 while the grooves 18 in the extended portion 27 make physical contact with the pins 19 as will be described in the functional description of the invention which will follow.

The reform jaw bases 26 are connected to means for moving the jaws radially to and from the module pins. In preferred form the means for moving the jaws radially are pneumatic cylinders 24 (see FIGS. 1 and 2) which are connected to the jaws by universal joints or the like. The cylinders 24 are mounted radially on the same center lines as the reform jaws 16, 17.

DESCRIPTION OF OPERATION

The operation of the radial reform head 10 is described primarily by referring to FIGS. 3 and 4. FIG. 4A shows the side reform jaws 16 and the corner reform jaws 17 in their initial position wherein the jaws are close to the insert 23, and there is a gap between the jaws and edges 20 so that un-reformed pins 19 can be inserted in between. In the example herein a module having a five row by five row array of pins is placed into position by a module handler 25 (shown in FIG. 2). Many suitable module handlers are known to those skilled in the art. The module handler 25 holds the module 22 and places it down vertically into aperture 13 so that the interior un-reformed module pins 19 are aligned with the holes in insert 23 and the perimeter pins are aligned with the grooves 18 of the side jaws 16 and of the corner jaws 17. At this point, the un-reformed pins 19 on the perimeter of module 11 are in position in the gap between the reform jaws 16, 17 and the edge of the top plate aperture 20, as shown in FIG. 3A.

After module insertion, the handler 25 sends a signal to an air solenoid which activates all pneumatic cylinders 24 simultaneously. The cylinders 24 activate all eight jaws simultaneously. The reform jaws are moved toward edge 20 as shown in FIG. 3B forcing the perimeter pins that are aligned with grooves 18 against edge 20. After the reform jaws start to move, but before the perimeter pins contact edge 20, the pins bent by the jaws are not parallel to the interior module pins. After the pins are forced against edge 20, they become parallel to the interior module pins. At this point all of the perimeter pins have been simultaneously formed into reformed pins 22. The side reform jaws 16 have reformed the perimeter rows of pins except for the corner pins, and the corner reform jaws 17 have reformed the corner pins. The edge of the top plate 20 serves as a positive stop, providing dimensional accuracy so that the pins are parallel to the non-reformed pins, and in proper position to mate with the holes of a board or card. There is no complex multi-axis motion translation since forces are only provided in the direction needed, i.e. radial linear motion. Thus, excellent reliability results which does not exist with cam and gear type systems that utilize multi-axis motion. FIG. 4B shows a plan view of the position of the jaws after the reform operation.

FIG. 3C shows the jaws moving back to their initial position. The jaws are spring biased so that they normally return to the initial position shown in FIGS. 3A and 4A. Next, the handler 25 lifts the module vertically out of the aperture 13 which completes the pin reform cycle. Each reform cycle takes approximately 0.5 seconds.

The present invention provides a radial reform head which can accurately reform the perimeter pins of modules so that modules can be easily inserted to cards and boards and to mitigate solder joint failure. Large manufacturing volumes of modules may have their pins reformed because of the excellent speed of each reform cycle and because the radial reform head's enhanced reliability allows for reduced interruptions in the pin reformation process due to tool failure.

While the present invention has been disclosed in connection with the preferred embodiment thereof, it should be understood that there may be other embodiments which fall within the spirit and scope of the invention as defined by the following claims.

We claim:

1. A reform head for reforming the shape of the perimeter pins of a semiconductor module, comprising:
   an annular plate have portions defining a rectangular aperture of predetermined edge dimensions,
   means for inserting and aligning the perimeter pins of a semiconductor module into said aperture,
   a plurality of movable jaws oriented radially around the center of said aperture at 45 degree intervals, each jaw comprising a base portion movable below said plate, and an extended portion containing grooves aligned with to be reformed perimeter pins movable within said aperture,
   means for moving said movable jaws radially to and from said pins,
   the extended portion of said jaws being moved against said perimeter pins, forcing said pins against the edges which define said aperture of said plate to reform the pins to a particular dimension.

2. The reform head of claim 1 wherein the predetermined dimensions of the edges which define said aperture in said plate control the length of a row of reformed module perimeter pins.

3. The reform head of claim 2 wherein at least one of said plurality of movable jaws are side reform jaws which each reform a particular row of perimeter pins except for the corner pins, and each of the remaining jaws of said plurality of movable jaws are corner reform jaws which each reform a particular corner pin.

4. The reform head of claim 3 wherein the number of side reform jaws is equal to the number of corner reform jaws.

5. The reform head of claim 4 wherein each of said side reform jaws are located 90 degrees from each other.

6. The reform head of claim 5 wherein each of said corner reform jaws are located 90 degrees from each other.

* * * * *